(12) United States Patent
Ujiie et al.

(10) Patent No.: US 6,661,093 B2
(45) Date of Patent: Dec. 9, 2003

(54) SEMICONDUCTOR DEVICE

(75) Inventors: Kenji Ujiie, Kokubunji (JP); Kenichi Yamamoto, Kodaira (JP); Junichi Arita, Musashimurayama (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/988,684

(22) Filed: Nov. 20, 2001

(65) Prior Publication Data

US 2002/0074656 A1 Jun. 20, 2002

(30) Foreign Application Priority Data

Nov. 30, 2000 (JP) ........................................ 2000-365486

(51) Int. Cl.[7] .............................................. H01L 23/48
(52) U.S. Cl. ..................................................... 257/738
(58) Field of Search ................................ 257/738, 737, 257/734–736, 748, 750, 762, 765, 771, 784

(56) References Cited

U.S. PATENT DOCUMENTS 6,022,792 A  *  2/2000  Ishii et al. ................... 438/462
6,111,317 A  *  8/2000  Okada et al. ................ 257/700

FOREIGN PATENT DOCUMENTS

| JP | 11-111885 | 10/1997 |
| WO | WO99/23696 | 10/1997 |

OTHER PUBLICATIONS

Albert W. Lin, "Taiwan APack Technologies: Targeting the Hybrid Analog–Digital Chip", Feb. 1999 Nikkei Microdevice, pp. 1–3; 57.

* cited by examiner

*Primary Examiner*—Craig Thompson

(57) ABSTRACT

For preventing α-rays induced soft errors in a semiconductor device in which solder bumps are connected with Cu wirings formed on Al wirings, bump lands connected with solder bumps and Cu wirings connected integrally therewith are constituted of a stacked film of a Cu film and an Ni film formed thereon, the thickness of the stacked film is larger than the thickness of the photosensitive polyimide resin film, the thickness of the inorganic passivation film, the thickness of the third Al wiring layer and the bonding pad and the thickness of the second interlayer insulative film formed below the Cu wirings and the bump land, that is, the bump land being constituted with such a thickness as larger than any of the thickness for the insulation material and the wiring material interposed between the MISFET (n-channel MISFET and p-channel MISFET) constituting the memory cell and the bump land.

16 Claims, 21 Drawing Sheets

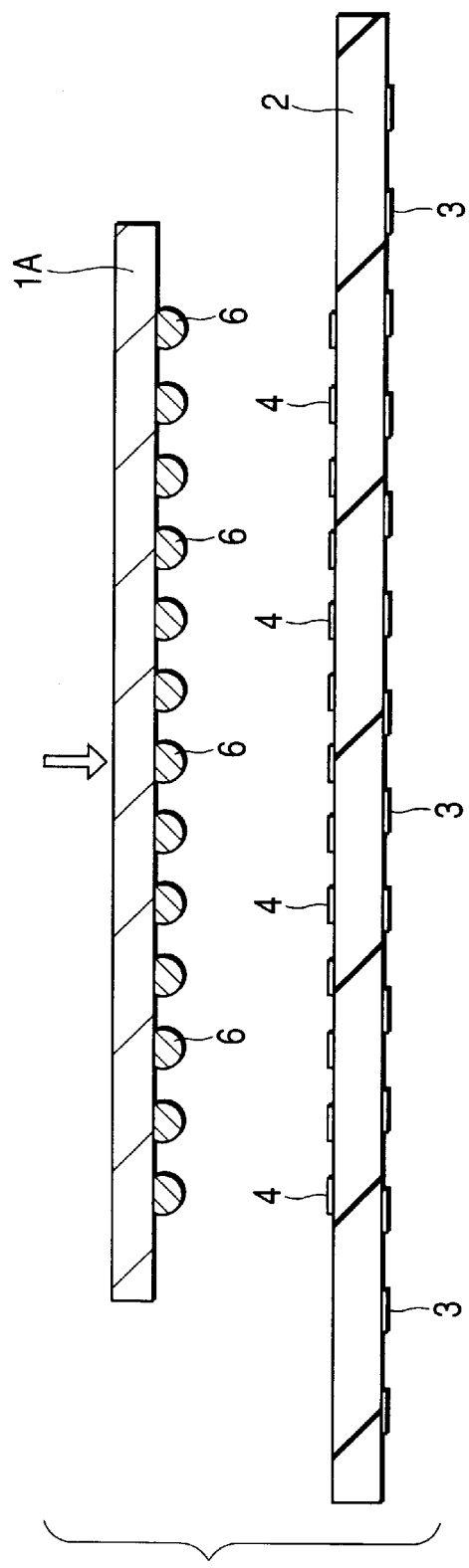
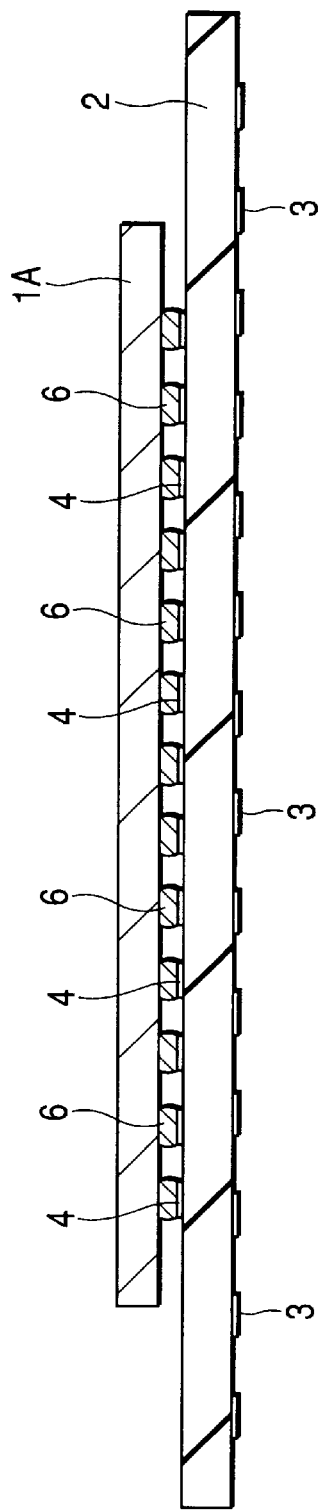

RESULT OF MEASUREMENT FOR α-RAY DOSE FROM Sn/1 Ag/ 0.5 Cu SOLDER

SEMICONDUCTOR DEVICE

BACKGROUND OF THE INVENTION

This invention concerns a semiconductor device and a manufacturing technique thereof and, more specifically, it relates to a technique effective for application to a semiconductor device manufactured by a process of forming Cu (copper) wirings and solder bumps on Al wirings prior to the step of dividing into semiconductor chips a semiconductor wafer in which circuit elements and Al (aluminum) wirings are formed.

A packaging technique called as a wafer level CSP (Chip Scale Package) or a wafer process package (Wafer Process Package: WPP) of integrating a package process (post-step) and a wafer process (pre-step) and forming a solder bump in each chip region of a semiconductor wafer prior to the step of dividing a semiconductor wafer, in which circuit elements and Al wirings are formed, into semiconductor chips is adapted to treat the package process by applying the wafer process and, accordingly, has an advantage capable of drastically reducing the number of steps compared with the existent method of treating the package process (post-step) on every semiconductor chips cut out of a semiconductor wafer. The wafer level CSP is described, for example, in "Nikkei Microdevice", p 38 to p 63 issued from Nikkei BP Co. (Feb. 1, 1999) or International Laid-Open No. WO99/23696 and corresponding U.S. patent application Ser. Nos. 09/530,490 and 09/627,008.

In the semiconductor device where the external connection terminals of the semiconductor chip is constituted of the solder bump as in the wafer level CSP described above, in a case where circuit elements include memory devices, it is necessary for a countermeasure to avoid soft errors of the memory cell caused by α-rays irradiated from a radioisotope elements contained, for example, in Pb (lead) in the materials constituting the solder bump.

1999 IEEE Electronic Components and Technology Conference Pb-Free Solder Alloys for Flip Chip Applications discloses a technique of constituting a solder bump using so-called Pb free solder not substantially containing Pb and disposing the solder bumps in a peripheral circuit region other than the memory cell forming region.

Japanese Published Unexamined Patent Application Hei 11(1999)-111885 concerns a BGA (Ball Grid Array) in which a wiring pattern for rearrangement is formed of a BLM film (underlayer film pattern formed with an aim of improvement for the adhesion and prevention for interdiffusion between the electrode pad and the solder bump), which enables α-ray shielding with no provision of additional materials to the existent process, by constituting the BLM film with a metal film (for example, Cu film) with an α-ray shielding ratio of 0.1 or less.

SUMMARY OF THE INVENTION

The present inventors have already developed a wafer process package for forming Cu wirings and solder bumps on Al wirings prior to the step of dividing a semiconductor wafer, in which circuit elements and Al wirings are formed, into semiconductor chips. Since the wafer process package contains memory devices in a portion of the circuit elements, it has been studied to constitute the solder bump with Pb-free solder not substantially containing Pb as a countermeasure for soft error caused by α-rays.

However, when the present inventors have measured α-dose from the Pb-free solder material comprising 98.5% of Sn (tin), 1% of Ag (silver) and 0.5% of Cu, it has been found that α-rays are radiated although a little also from the Pb-free solder material as shown in FIG. 26. In this case, the measuring time for the α-rays was 200,000 sec and the diameter of the solder bump was 2.5 cm.

While the α-dose contained in the Pb-free solder material is quite a little compared with the α-dose contained in Pb, even the slight amount of α-dose as described above gives inneglibible effect on the memory cells in a case where the minimum publication size is reduced to about 0.2 μm or less.

As a countermeasure for avoiding the effect of α-rays contained in the solder bump, it may be considered to use a solder material at high purity in which the amount of the radioisotope elements is decreased greatly but since the soldering material at high purity is extremely expensive, it is difficult to apply the same to a general purpose wafer process package.

Further, as other α-ray countermeasure, it may be considered a method of not disposing the solder bump above the memory device, increasing to make the thickness of an insulative film interposed between a solder bump connection portion constituted of a portion of Cu wirings (hereinafter also referred to as a bump land) and Al wirings (for example 30 μm or more) or disposing a thick resin layer additionally between the bump land and the insulative film, thereby shielding α-rays by the insulative film or the resin layer.

However, the method of not disposing the solder bump above the memory device restricts the area for disposing the bump on the semiconductor chip to inevitably narrow the pitch for the solder bumps. Accordingly, since an expensive wiring substrate corresponding to the narrowed pitch has to be provided for mounting the semiconductor chip, it is difficult to apply the method to the general purpose wafer process package. Further, in a case where the thickness of the insulative layer (or resin layer) interposed between the bump land (Cu wirings) and the Al wirings is increased, since the depth of the aperture connecting the Cu wirings formed in the resin insulative layer (or resin layer) and the Al wirings is increased, a large step is formed between the Cu wirings and the Al wirings to bring about another problem of lowering the connection reliability between both of them.

This invention intends to provide a technique capable of preventing α-ray induced soft errors of a semiconductor device manufactured by a process of forming Cu wirings and semiconductor bumps on Al wirings prior to the step of dividing a semiconductor wafer, in which circuit elements and Al wirings are formed, into semiconductor chips.

The foregoings and other objects, as well as novel features of the present invention will become apparent by reading the descriptions of the specification and the appended drawings.

Among the inventions disclosed in the present application, outlines of typical inventions will be explained simply as below.

This invention provides a semiconductor device manufactured by a process of forming Cu wirings and solder bumps on Al wirings prior to the step of dividing a semiconductor wafer, in which circuit elements and Al wirings are formed, into semiconductor chips, wherein the film thickness of the bump electrode connection portion (bump land) is made larger than the film thickness of the bonding pad constituted of a portion of an uppermost Al wiring layer.

According to the device described above, since the α-rays radiated from the radioisotope element in the soldering bump are shielded by the bump electrode connection portion, α-ray induced soft errors can be prevented with no addition of new manufacturing steps or without using expensive materials.

BRIEF DESCRIPTION OF THE DRAWINGS

FIG. 22 is a cross sectional view showing a chip mounting step of a semiconductor device as one embodiment according to this invention;

FIG. 23 is a cross sectional view showing a chip mounting step of a semiconductor device as one embodiment according to this invention;

DETAILED DESCRIPTION OF PREFERRED EMBODIMENTS

Figure 1:
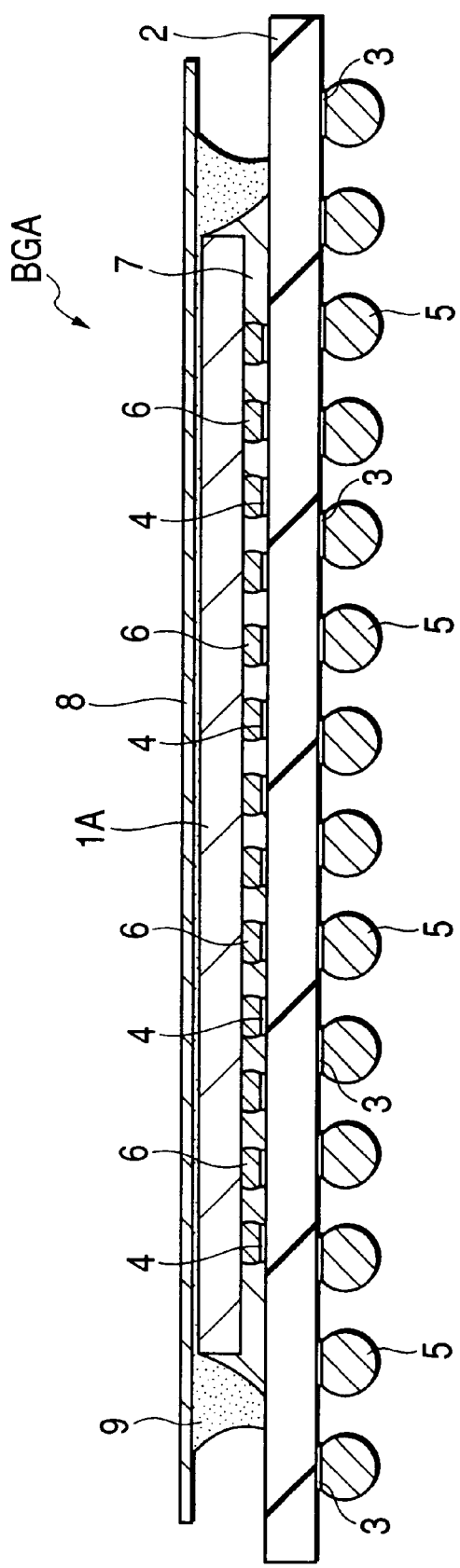
FIG. 1 is a cross sectional view of a semiconductor device as one embodiment of this invention.

Preferred embodiments of this invention are to be explained in details by way of appended drawings. For explanation of the preferred embodiments, those having identical functions carry the same reference numerals throughout the drawings, for which duplicate explanations are to be omitted.

Embodiment 1

As shown in FIG. 1, a semiconductor device of this embodiment is in a BGA (Ball Grid Array) in which one silicon chip 1A is face down-bonded on a main surface of a package substrate 2.

The package substrate 2 is constituted of a general-purpose printed wiring substrate in which Cu wirings are formed on a substrate comprising a glass epoxy resin, BT (Bis-maleimide Triazine) resin or the like, and plural solder bumps 5 constituting external connection terminals for BGA are connected to electrode pads 3 at the rear face (lower surface) thereof. While not being restricted particularly, the outer size of the package substrate 2 is length×width=14 mm×22 mm, and the number of solder bumps 5 is 119. Further, the diameter for the solder bump is 750 µm and the pitch between adjacent solder bumps 5 is 1.27 mm.

The silicon chip 1A is mounted by a flip chip system of connecting each of plural semiconductor bumps 6 formed on the main surface thereof to each of corresponding electrode pads 4 on the main surface of the package substrate 2. An under fill resin 7 comprising, for example, a silicon filler-added epoxy resin is filled in the gap between the silicon chip 1A and the package substrate 2. The under fill resin 7 has both the function of moderating stresses caused by the difference of the heat expansion coefficients between the silicon chip 1A and the package substrate 2 and applied to the solder bumps 6 as the connection portion for both of them and the function of preventing moisture from intruding to the main surface of the silicon chip 1A. A metal protective plate 8 is attached by means of adhesive 9 to the rear face (upper surface) of the silicon chip 1A.

Figure 2:
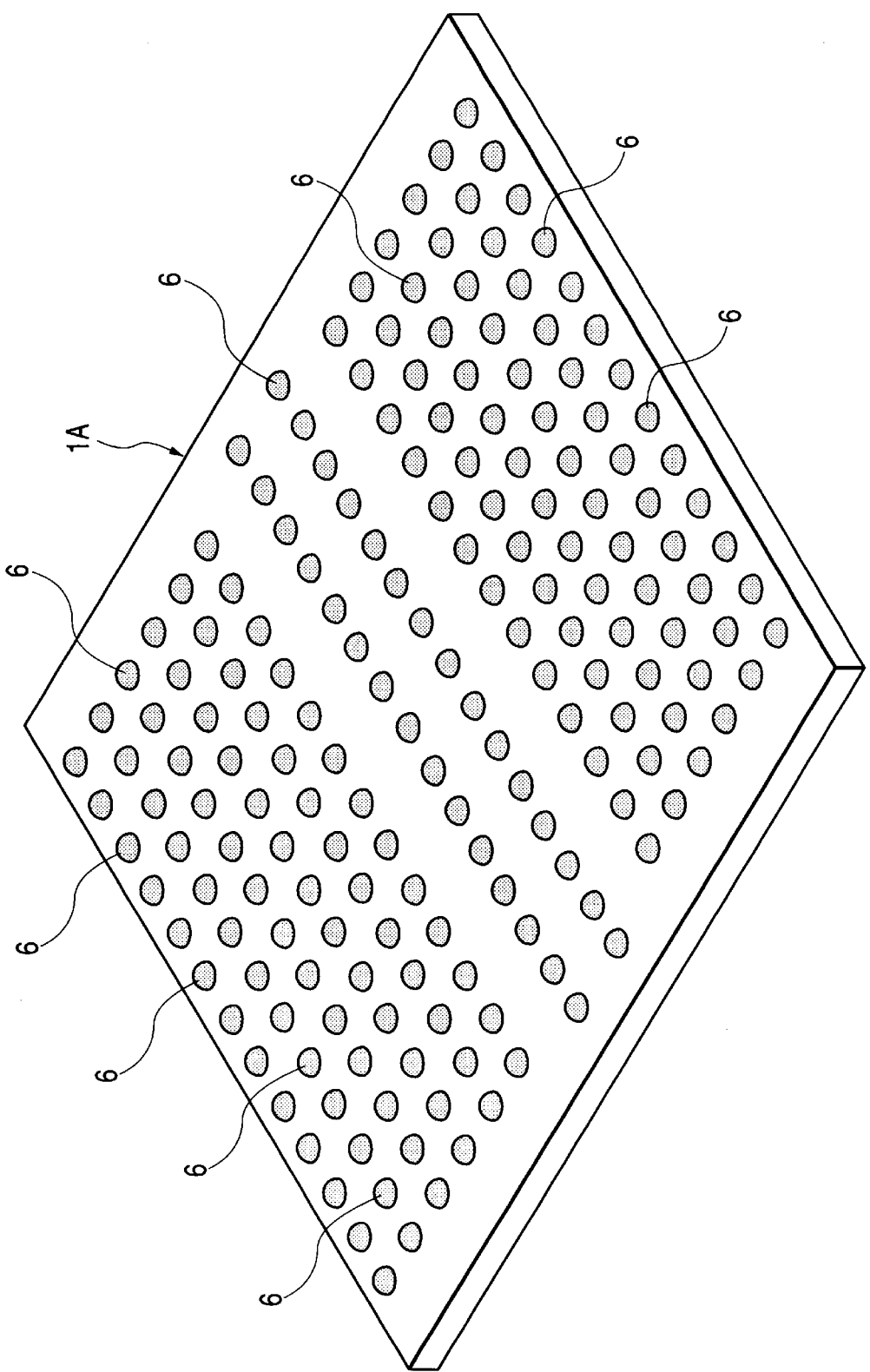
FIG. 2 is a perspective view of a semiconductor chip mounted in a semiconductor device as one embodiment according to this invention.

FIG. 2 is a perspective view showing a main surface of the silicon chip 1A. Plural solder bumps 6 described above are arranged in a matrix on the main surface of the silicon chip 1A. While not being restricted particularly, the outer size of the silicon chip 1A is length×width=8 mm×9 mm and the number of the solder bumps 6 is 196. Further, the diameter of the solder bump is about 200 μm and the pitch between the adjacent solder bumps 4 is 0.54 mm. The solder bump 6 is constituted of a Pb-free solder (melting point=220° C. to 230° C.) not substantially containing Pb (lead) and comprising, for example, 98.5% of Sn (tin), 1% of Ag (silver) and 0.5% of Cu.

Figure 3:
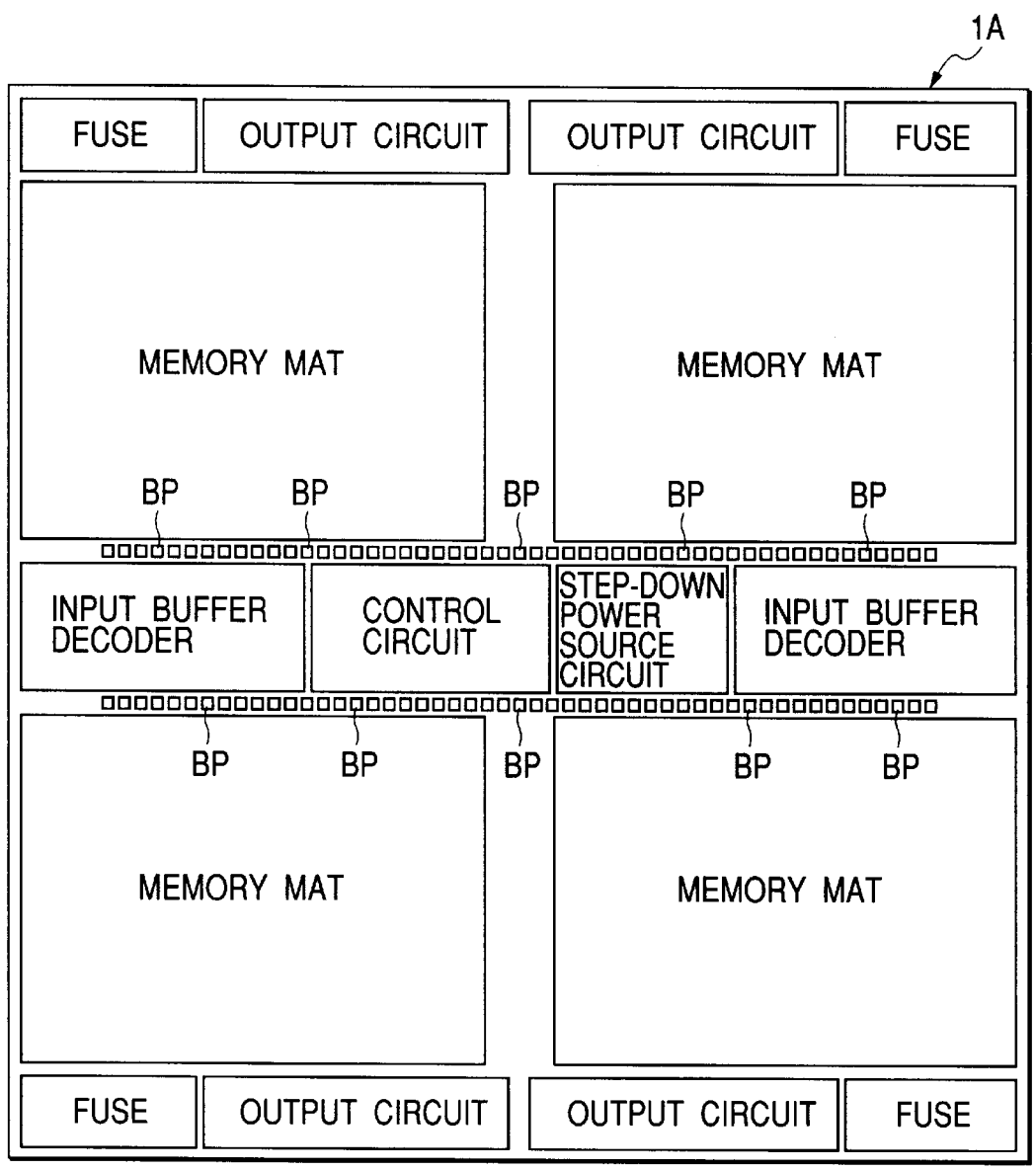
FIG. 3 is a circuit block diagram of a semiconductor chip mounted in a semiconductor device as one embodiment according to this invention.

An SRAM (Static Random Access Memory) having a storage capacity of 8 Mbit is formed on the main surface of the silicon chip 1A. The SRAM is used, for example, to a cash memory of a work station and comprises, as shown in FIG. 3, a memory section divided into plural memory mats and a peripheral circuit section comprising input/output circuits (input buffer decoder, output circuit), control circuits and a step-down power source circuit. Further, plural bonding pads BP are arranged in two rows in the right-to-left direction in the drawing at a central portion on the main surface of the silicon chip 1A.

Figure 4:
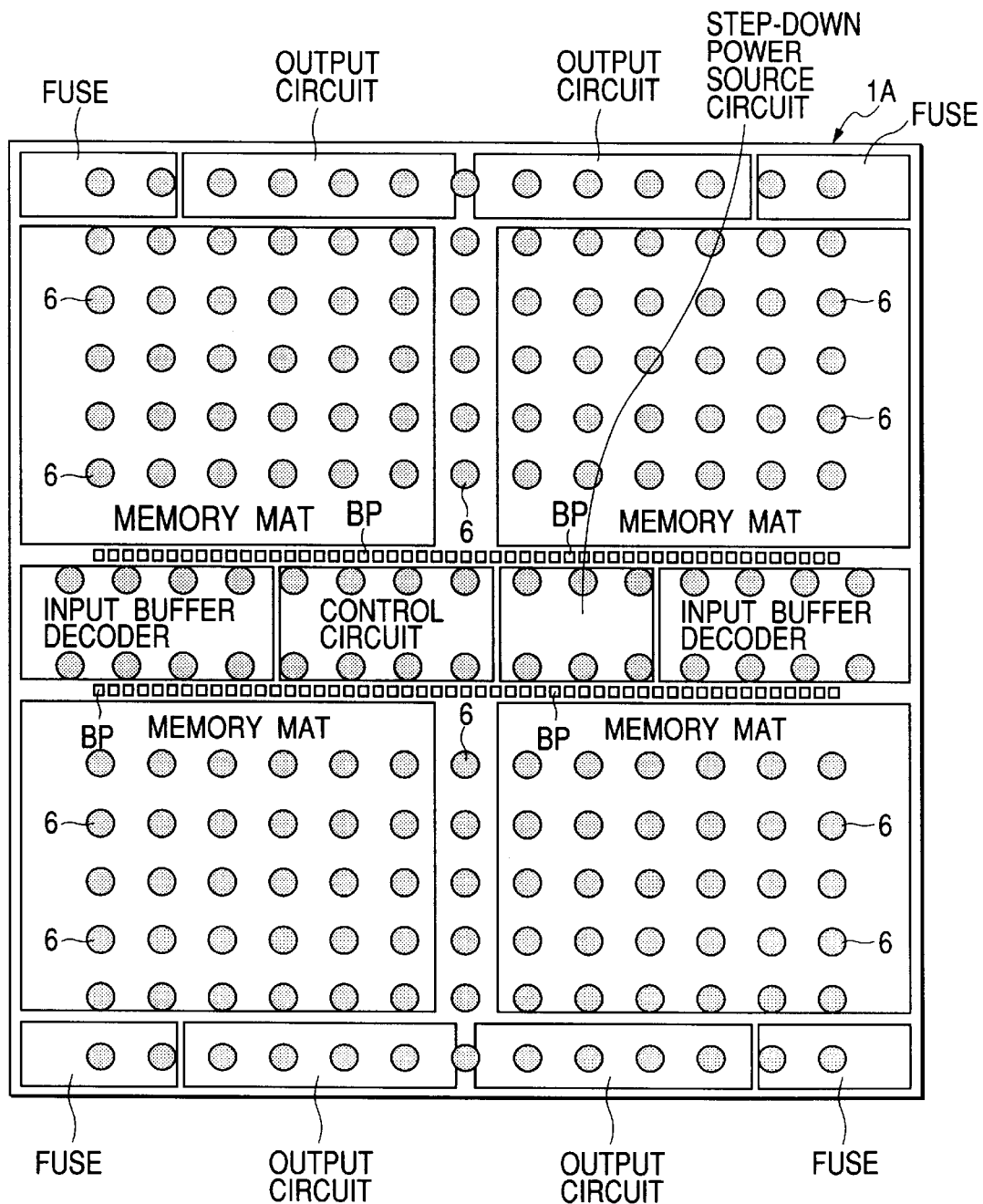
FIG. 4 is a plan view in which solder bumps shown in FIG. 2 and a circuit block shown in FIG. 3 are stacked.

FIG. 4 is a plan view in which the solder bumps 6 shown in FIG. 2 and the circuit block shown in FIG. 3 are stacked. As shown in the drawing, the solder bumps 6 are arranged substantially over the entire region of on the main surface of the silicon chip 1A, a portion thereof being arranged above the memory mats and the other portion thereof being arranged on the peripheral circuit sections. On the other hand, bonding pads BP are arranged between the memory section and the peripheral circuit section, that is, in the region where the circuits are not formed.

Figure 5:
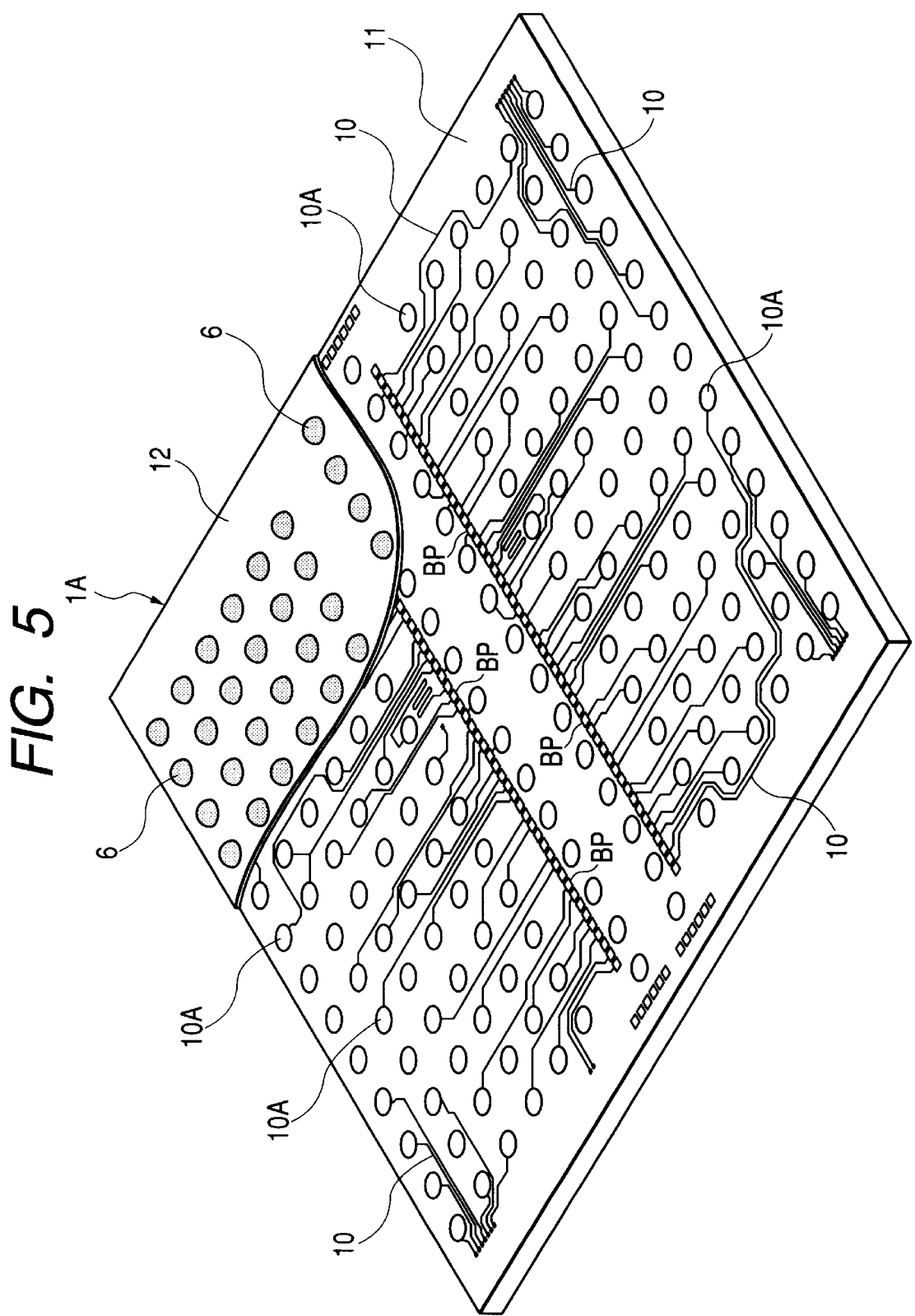
FIG. 5 is a perspective view showing Cu wirings of a semiconductor chip mounted in a semiconductor device as one embodiment according to this invention.
Figure 6:
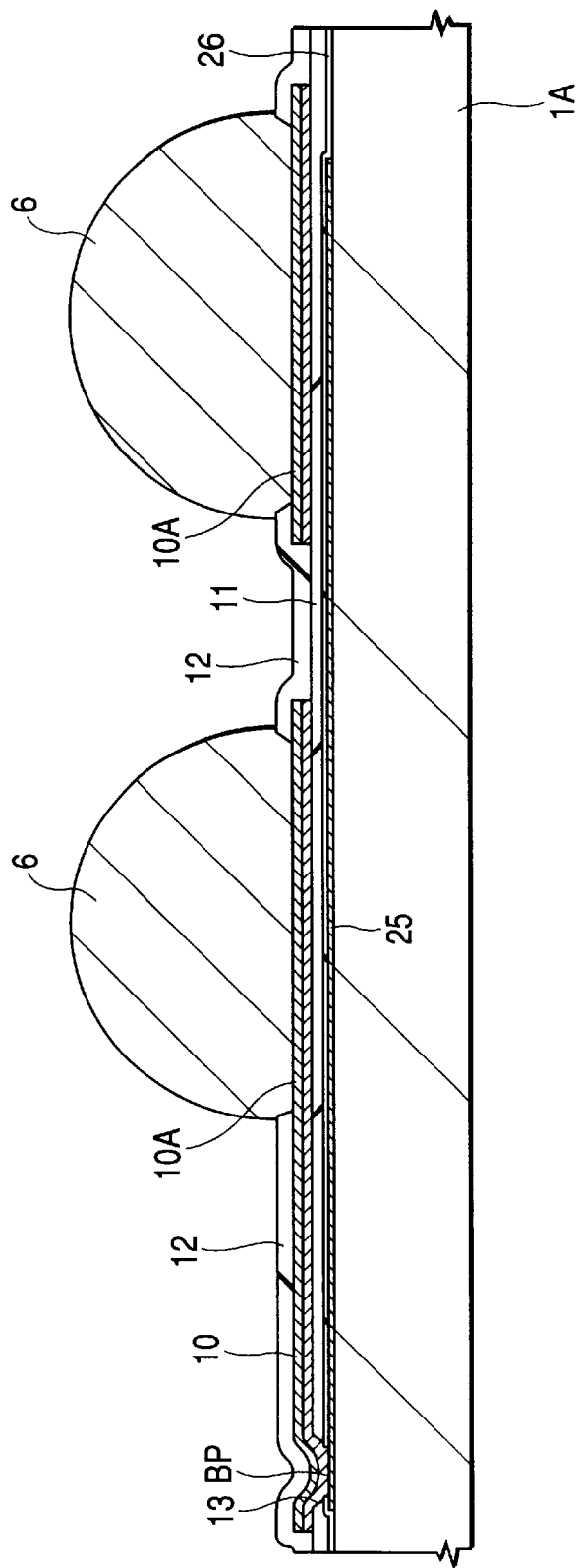
FIG. 6 is a cross sectional view showing a portion of a semiconductor chip mounted in a semiconductor device as one embodiment according to this invention.

FIG. 5 is a perspective view showing a portion of Cu wirings 10 connected with the soldering bumps 6 and FIG. 6 is a cross sectional view for a main portion of the silicon chip 1A.

The main surface of the silicon chip 1A is covered with an uppermost protective film layer 12 except for the region where the semiconductor bumps 6 are formed. The uppermost protective film layer 12 is constituted of a photosensitive polyimide resin film of about 15 μm thickness. Cu (copper) wirings 10 and bump lands (bump electrode connection portions) 10A constituting one end thereof are formed below the uppermost protective film 12, and the solder bumps 6 are connected to the upper surface of the bump lands 10A. The method of forming the Cu wirings 10 and the bump lands 10A is to be described later.

A photosensitive polyimide resin film 11 of about 5 μm thickness is formed below the Cu wirings 10 and the bump lands 10A. The other end of the Cu wirings 10 is connected electrically through an aperture 13 formed in the photosensitive polyimide resin film 11 with the bonding pad BP.

Figure 7:
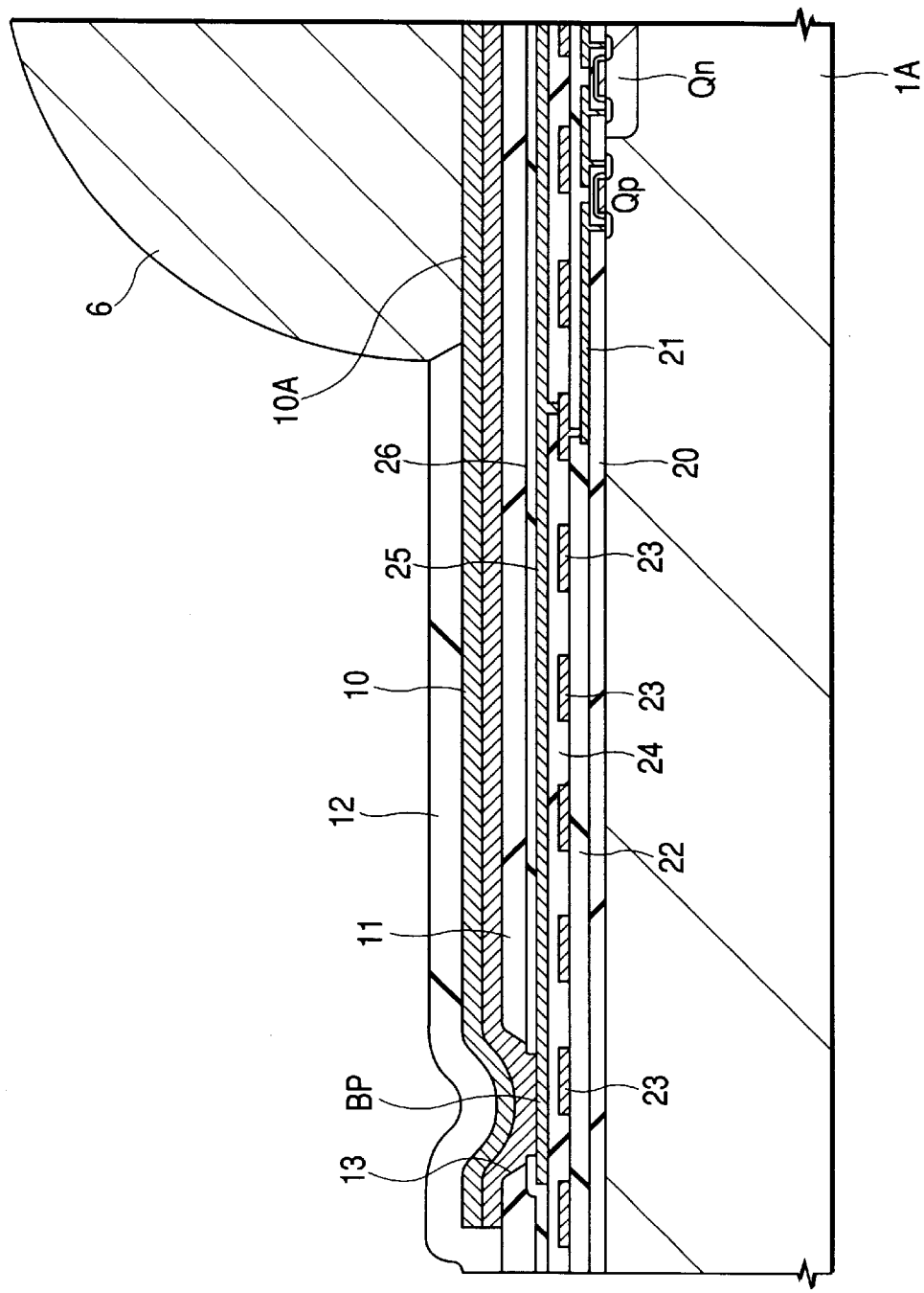
FIG. 7 is an enlarged cross sectional view for a main portion of FIG. 6.

FIG. 7 is an enlarged cross sectional view for a portion of FIG. 6. An n-channel MISFETQn and a p-channel MISFETQp constituting the memory cell or the peripheral circuit for the SRAM are formed on the main surface of the silicon chip 1A. The n-channel MISFETQn and the p-channel MISFETQp constituting the memory cell are formed each with a minimum fabrication size of 0.2 μm or less, for example, a minimum fabrication size of 0.18 μm or less.

Above the n-channel MISFETQn and the p-channel MISFETQp, are formed an insulative film 20, a first Al wiring layer 21, a first interlayer insulative film 22, a second Al wiring layer 23, a second interlayer insulative film 24, a third Al wiring layer 25, and an inorganic passivation film 26 successively in this order from the lower layer. In actual silicon chip 1A, four or more Al wiring layers are sometimes formed but explanation is made to a case where the Al wirings comprises three layers.

First to third Al wiring layers 21, 23, 25 are constituted of Al alloy films. The thickness of the third Al wiring layers as the uppermost wiring layer is about 0.8 μm and the thickness of the first and the second Al wiring layers 21, 23 is less than that.

The insulative film 20, the first and second interlayer insulative films 22, 24 are constituted each with a silicon oxide film. The thickness of the second interlayer insulative film 24 is about 2 μm and the thickness of the first interlayer insulative film 22 and that of the insulative film 20 is less than that.

The inorganic passivation film 26 is constituted, for example, with an insulative film of stacking a silicon oxide film of about 0.3 μm thickness and a silicon nitride film of about 1.3 μm thickness. The bonding pad BP is formed by etching the inorganic passivation film 26 above the third Al wiring layer 25 as the uppermost wiring layer to expose a portion of the third Al wiring layer 25.

The Cu wirings 10 and the bump land 10A in this embodiment are constituted of a stacked film of a Cu film of about 6 μm thickness and an Ni (nickel) film of about 3 μm thickness formed thereon. The thickness of the laminate film (about 9 μm) is larger compared with the thickness (about 5 μm) of the photosensitive polyimide resin film 11, the thickness (about 1.6 μm) of the inorganic passivation film 26, the thickness (about 0.8 μm) of the third Al wiring layer 25 and the bonding pad BP and the thickness (about 2 μm) of the second interlayer insulative film 24, which are formed below the Cu wirings 10 and the bump land 10A. That is, the Cu wirings 10 and the bump land 10A are constituted to a thickness larger than any of the insulation materials and wiring materials interposed between the MISFET (n-channel MISFETQn and p-channel MISFETQp) constituting the memory cell and the Cu wirings 10 and the bump land 10A.

The Cu film and the Ni film constituting the Cu wirings 10 and the bump land 10A have α-ray shielding effect higher by two to three times compared with the insulation materials of an identical thickness (for example, silicon oxide film, silicon nitride film or polyimide film). Accordingly, when the Cu wirings 10 and the bump land 10A are constituted with such a larger thickness, α-rays radiated from the radioisotope elements contained in the solder bumps 6 connected on the bump land 10A can be effectively shielded by the bump land 10A. Further, when the thickness of the Cu wiring 10 is increased, the resistance value can be reduced by one digit or more (10 times or more and less than 100 times) than the resistance value of the first to third Al wiring layers 21, 23, 25.

Figure 8A:
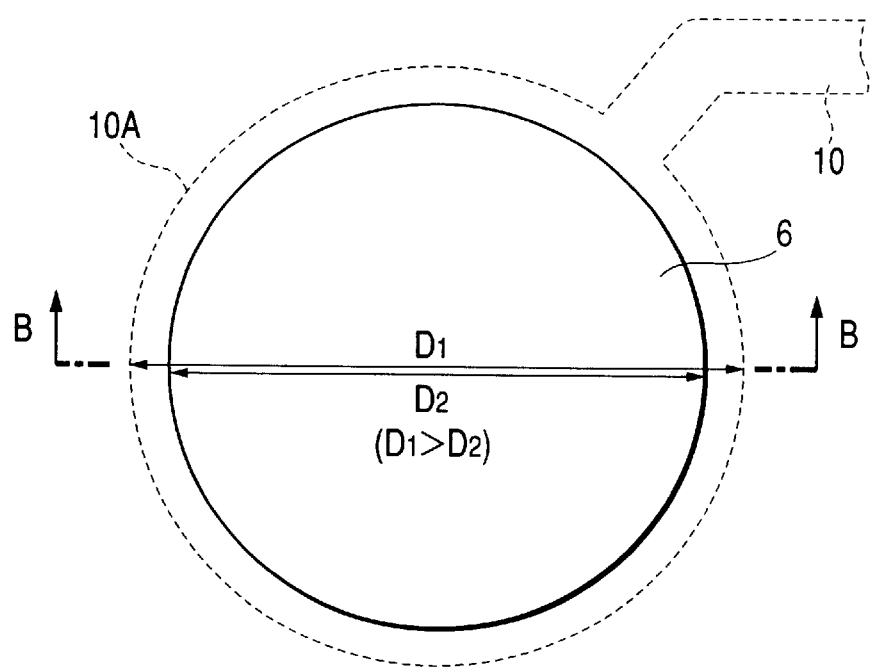
FIG. 8(a) is a plan view showing a relation between the diameter of a bump land and the diameter of a solder bump connected thereon and FIG. 8(b) is a cross sectional view taken along line B—B in FIG. 8(a)
Figure 8B:
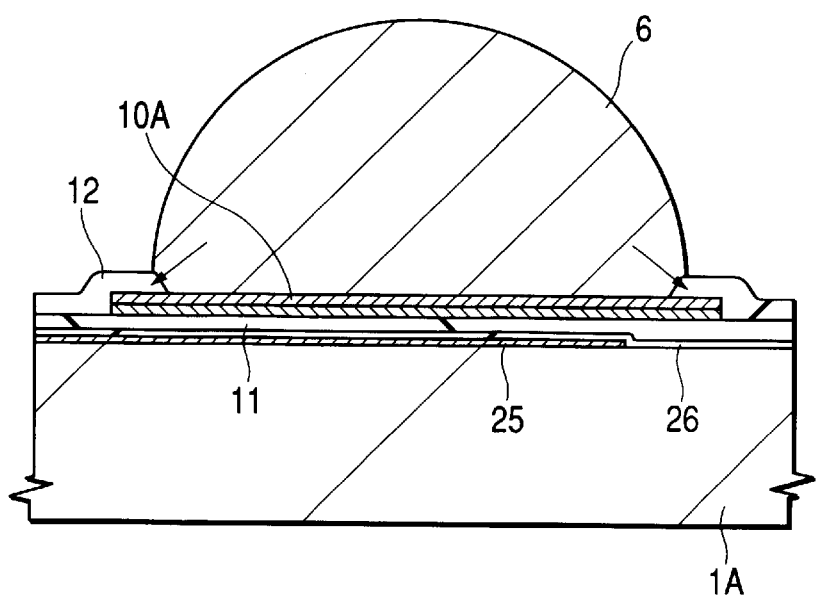

FIG. 8(a) is a plan view showing a relation between the diameter ($D_1$) of the bump land 10A and the diameter ($D_2$) of the solder bump 6 connected thereon and FIG. 8(b) is a cross sectional view taken along line B—B in FIG. 8(a).

As illustrated, in this embodiment, the diameter ($D_1$) of the bump land 10A is made rather than the diameter ($D_2$) of the solder bump 6 ($D_1>D_2$). With this constitution, since the bump land 10A extends outward of the solder bump 6, α-rays radiated in the orthogonal direction from the solder bump 6 (direction shown by arrow sin FIG. 8(b)) can also be shielded effectively by the bump land 10A. It is desirable that the diameter ($D_1$) of the bump land 10A is at least greater by 50 μm or more than the diameter ($D_2$) of the solder bump.

Then, the method of manufacturing the BGA is to be explained in the order of steps with reference to FIG. 9 to FIG. 25.

Figure 9:
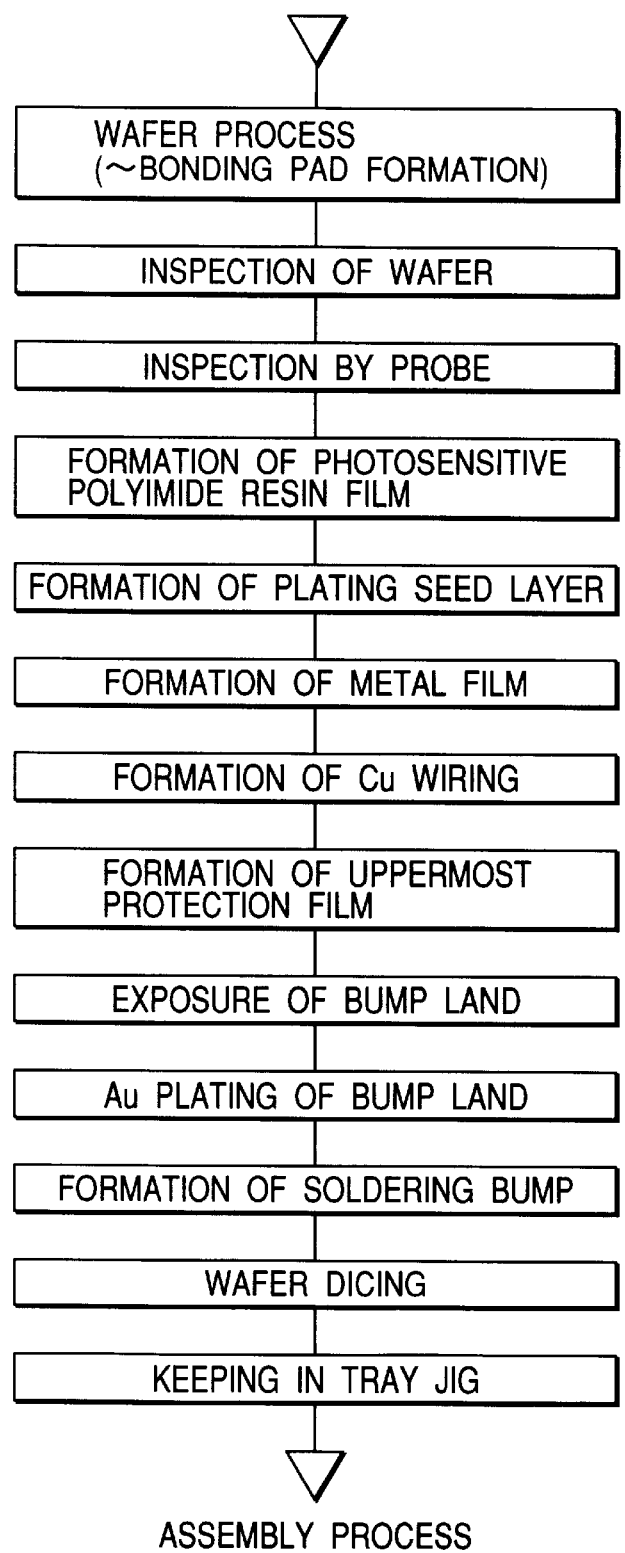
FIG. 9 is a flow chart showing a portion in a method of manufacturing a semiconductor device (pre-step) as one embodiment according to this invention.
Figure 10:
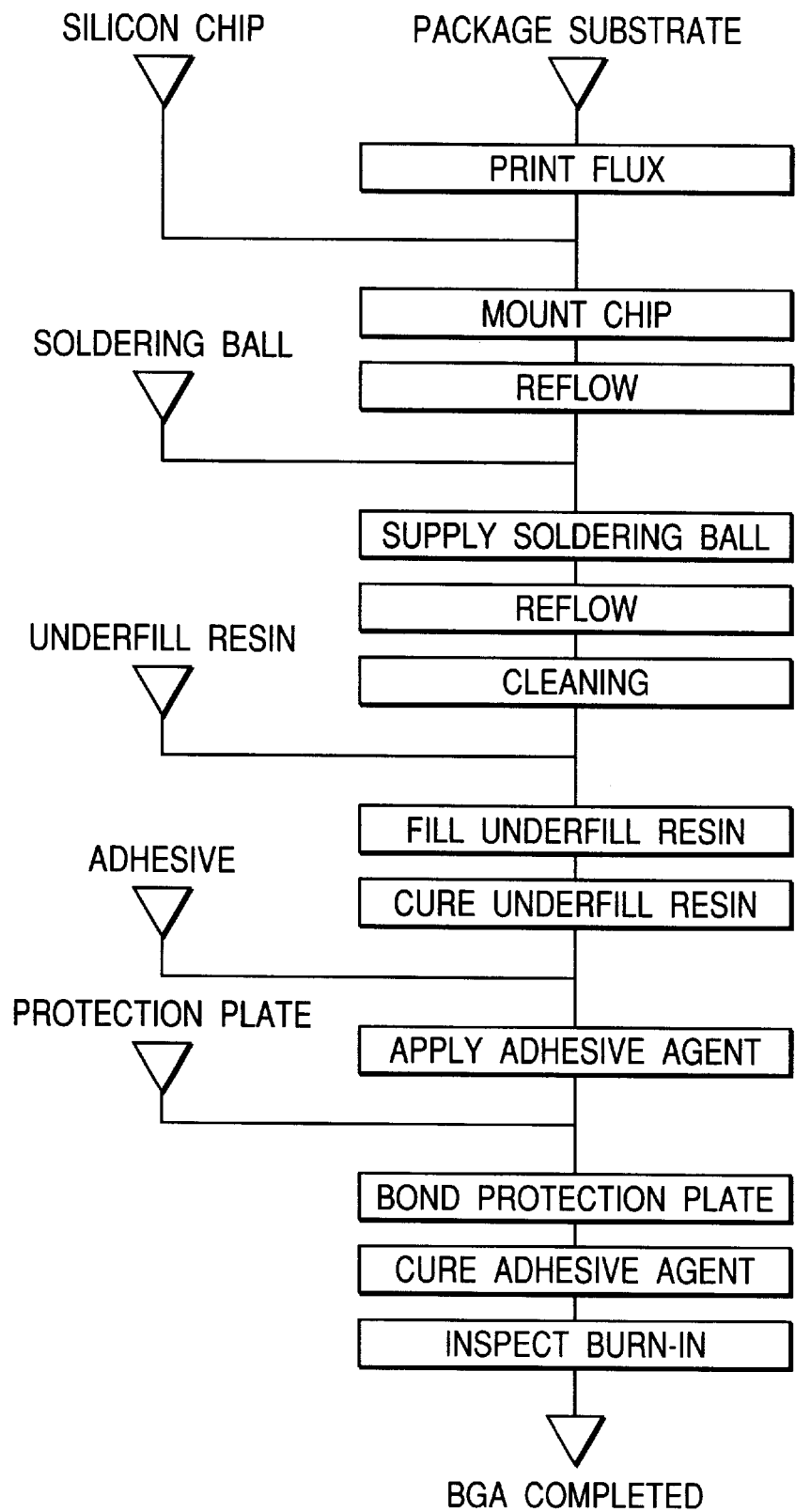
FIG. 10 is a flow chart showing another portion in a method of manufacturing a semiconductor device (post-step) as one embodiment according to this invention.

FIG. 9 is a production flow chart showing the step up to cutting a silicon chip out of the silicon wafer (pre-step) and FIG. 10 is a production flow chart showing the step till the silicon chip is mounted on the package substrate to assembly a BGA (post-step).

Figure 11:
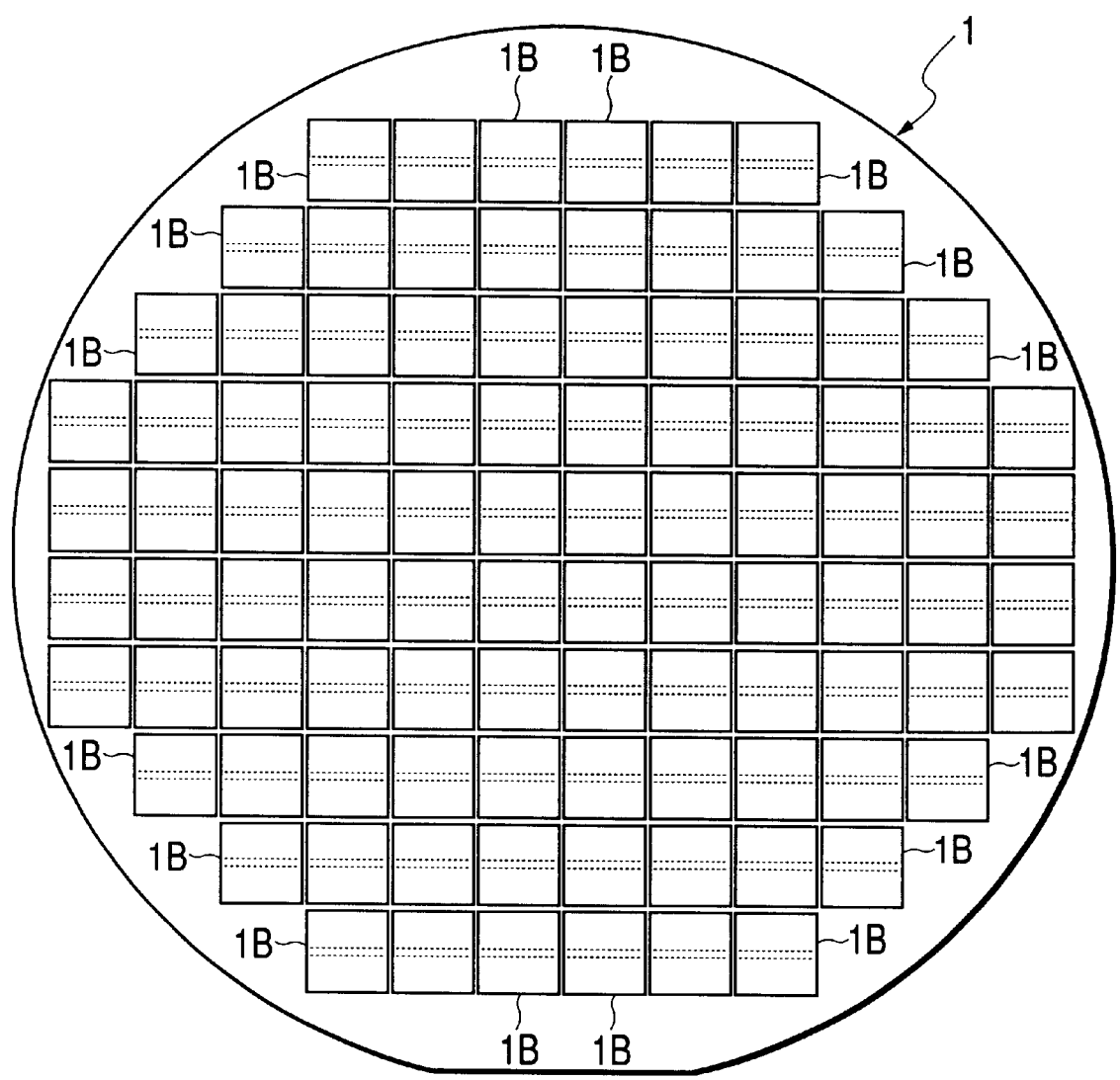
FIG. 11 is a plan view of a semiconductor wafer showing a method of manufacturing a semiconductor device as one embodiment according to this invention.

For producing the BGA, a silicon wafer 1 is as shown in FIG. 11 at first provided. Plural chip regions 1B are partitioned in a matrix on the main surface of the silicon wafer 1 and an SRAM having the circuit blocks as shown in FIG. 3 is formed in each of the chip regions 1B.

Figure 12:
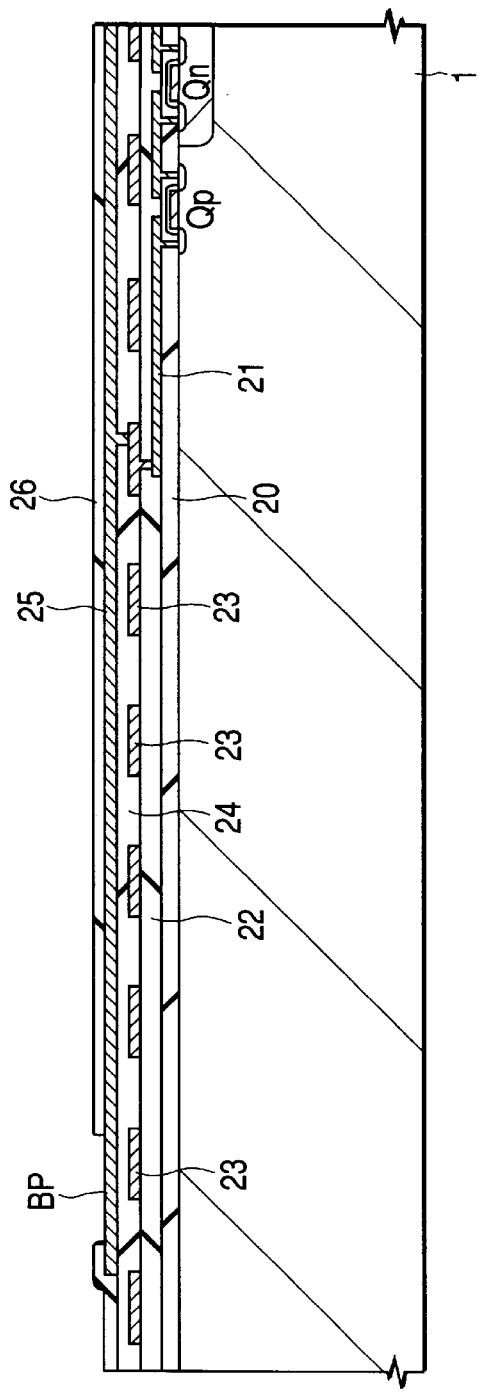
FIG. 12 is a cross sectional for a main portion of a semiconductor wafer showing a method of manufacturing a semiconductor device as one embodiment according to this invention.

As shown in FIG. 12, a circuit is constituted in the SRAM with an n-channel MISFETQn, a p-channel MISFETQp and first to third Al wiring layers 21, 23, 25. The MISFETs and wirings constituting the circuit of the SRAM are formed by a well-known wafer process. Further, a bonding pad BP is arranged at the central portion of each chip region 1B by etching an inorganic passivation film 26 covering the surface of the third Al wiring layer 25 as the uppermost wiring layer to expose a portion of the third Al wiring layer 25. Each of the chip regions 1B is subjected to wafer inspection and probe inspection in a stage where the bonding pad BP is formed to judge and check the SRAM.

Figure 13:
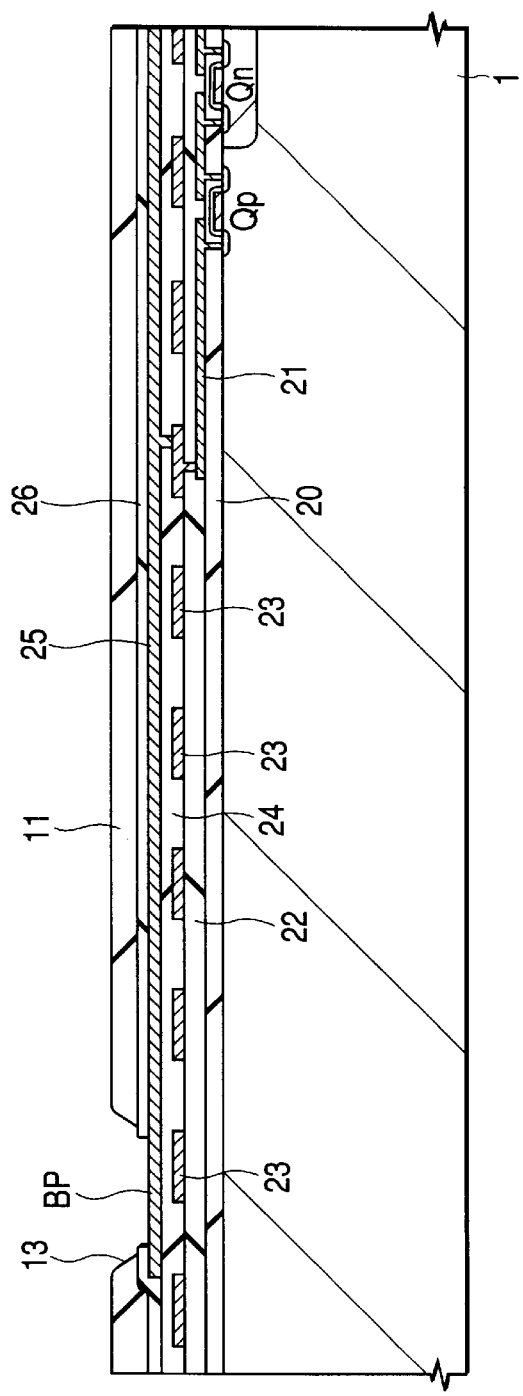
FIG. 13 is a cross sectional view for a main portion of a semiconductor wafer showing a method of manufacturing a semiconductor device as one embodiment according to this invention.

Then, as shown in FIG. 13, after forming a photosensitive polyimide resin film 11 on the inorganic passivation film 26 by a rotational coating method, an aperture 13 is formed to the photosensitive polyimide resin film 11 to expose the surface of the bonding pad BP. The aperture 13 is formed by exposing and baking the photosensitive polyimide resin film 11 in the region other than that above the bonding pad BP into a semi-hardened state and, successively, removing by development the not-exposed (unhardened) portion above the bonding pad BP. The photosensitive polyimide resin film 11 functions together with the inorganic passivation film 26 therebetween as an interlayer insulative film that insulates the third Al wiring layer 25 and the Cu wirings 10 to be formed subsequently.

Figure 14:
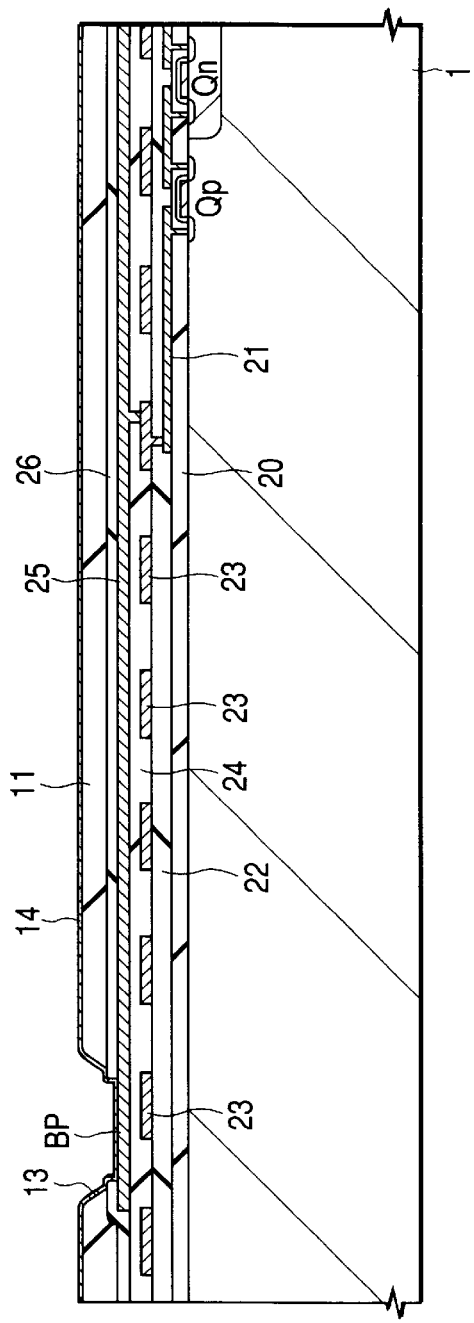
FIG. 14 is a cross sectional view for a main portion of a semiconductor wafer showing a method of manufacturing a semiconductor device as one embodiment according to this invention.

Then, after completely hardening the semi-hardened photosensitive polyimide resin film 11 by baking the wafer 1, a plating seed layer 14 is formed on the photosensitive polyimide film 11 including the surface of the bonding pad BP exposed at the bottom of the aperture 13 as shown in FIG. 14. The plating seed layer 14 is constituted, for example, with a Cr film of about 50 nm to 150 nm thickness and a Cu film of about 0.1 μm to 0.7 μm thickness deposited by sputtering.

Figure 15:
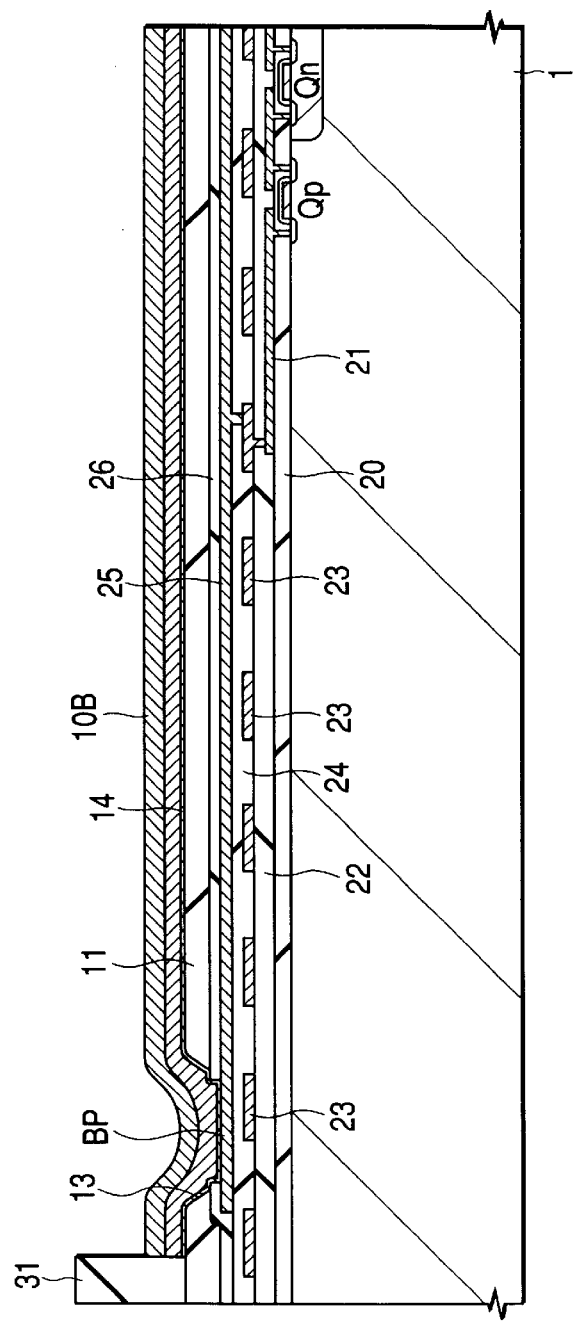
FIG. 15 is a cross sectional view for a main portion of a semiconductor wafer showing a method of manufacturing a semiconductor device as one embodiment according to this invention.

Then, as shown in FIG. 15, a photoresist film 31 in which a Cu wiring forming region is apertured is formed on the plating seed layer 14 and a metal film 10B is formed on the surface of the plating seed layer 14 by electrolytic plating using the photoresist film 31 as a mask. The metal film 10B is constituted of a Cu film of about 6 μm thickness and an Ni film of about 3 μm thickness. The Ni film above the Cu film is formed in order to prevent the disadvantage that Sn as the main ingredient of the solder bump 6 diffuses into the Cu film to embrittle the bump land 10A and the Cu wirings 10.

As described above, since the metal film 10B constituting the Cu wirings 10 and the bump land 10A to a large thickness, α-rays radiated from the radioisotope elements contained in the solder bump 6 connected on the bump land 10A can be shielded effectively by the bump land 10A. While the metal film 10B can be formed by other method than the plating method, for example, by sputtering, increase of the film thickness and size reduction of the wire width can be facilitated by forming the film with electrolytic plating.

Figure 16:
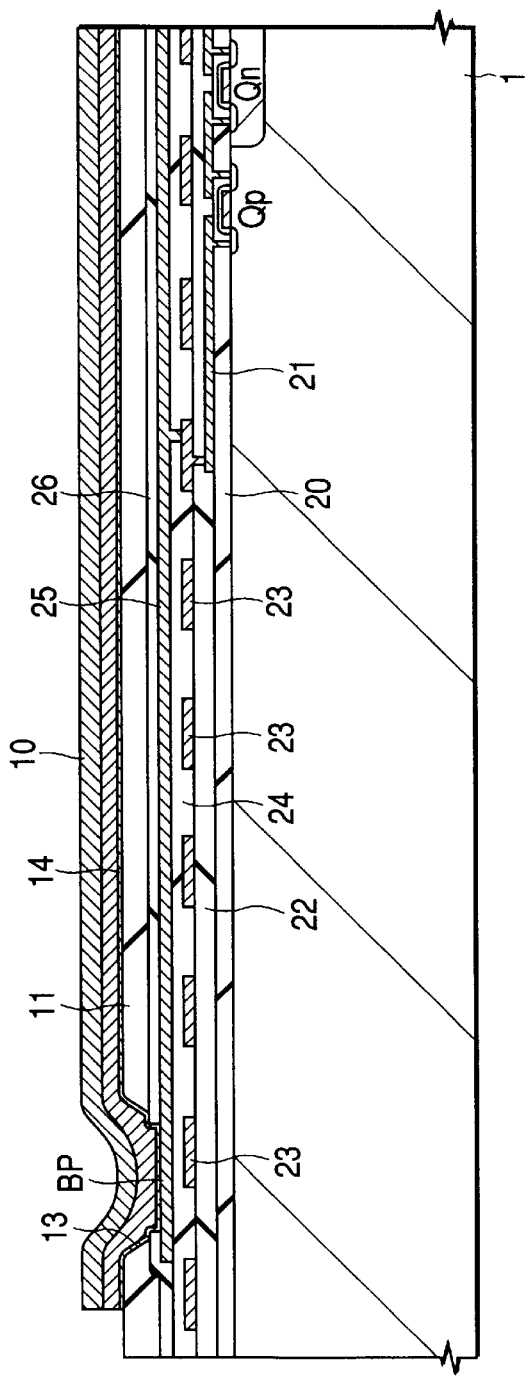
FIG. 16 is a cross sectional view for a main portion of a semiconductor wafer showing a method of manufacturing a semiconductor device as one embodiment according to this invention.

Then after removing the photoresist film 31, the unnecessary plating seed layer 14 left on the photosensitive polyimide resin film 11 in the region other than the Cu wiring forming region is removed by wet etching to form a Cu wiring layer 10 comprising the metal film 10B as shown in FIG. 16. When the plating seed layer 14 is removed by wet etching, the surface of the metal film 10B (Cu wirings 10) is also etched but, since the thickness is much larger compared with that of the plating seed layer 1, this causes no troubles.

Figure 17:
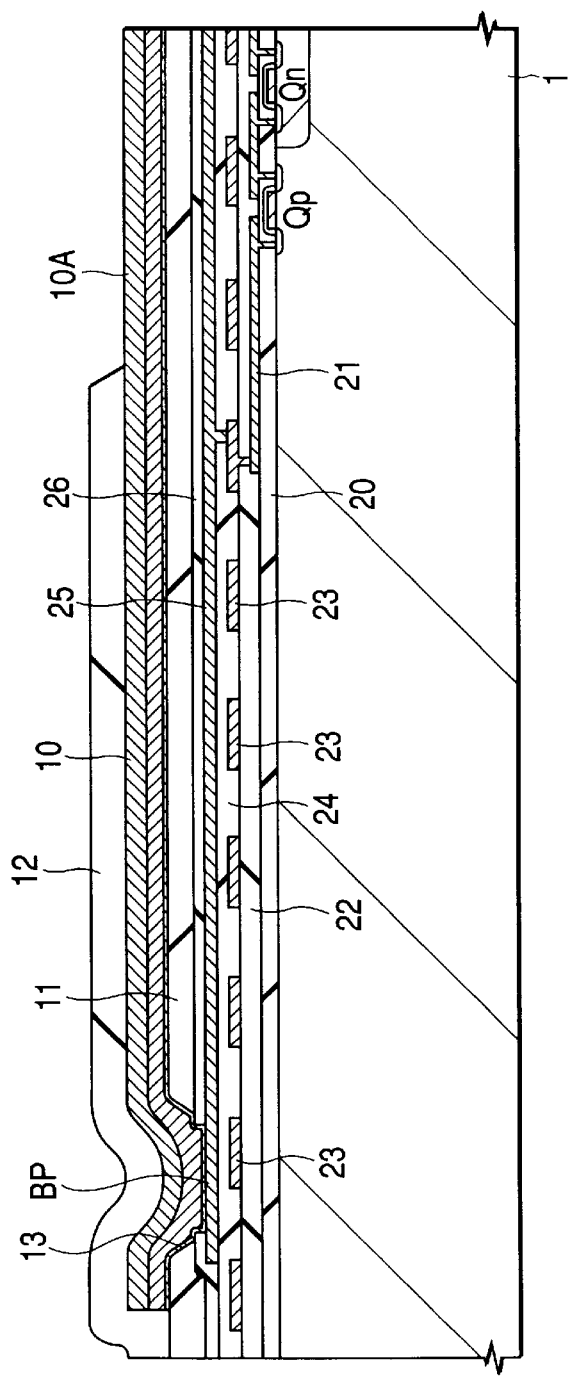
FIG. 17 is a cross sectional view for a main portion of a semiconductor wafer showing a method of manufacturing a semiconductor device as one embodiment according to this invention.
Figure 18:
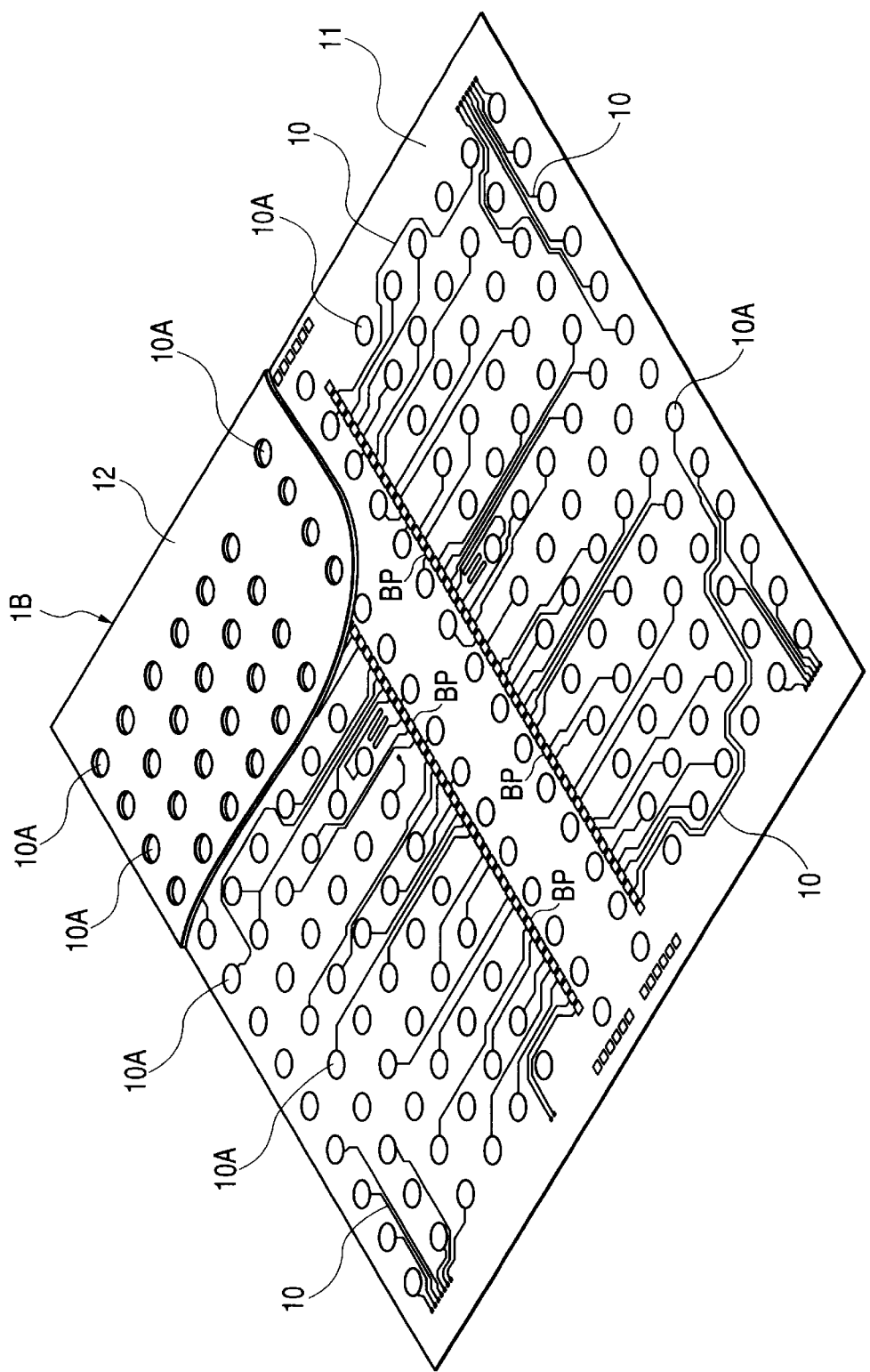
FIG. 18 is a perspective view for a main portion of a semiconductor wafer showing a method of manufacturing a semiconductor device as one embodiment according to this invention.

Then, as shown in FIG. 17 and FIG. 18, after forming an uppermost protective film layer 12 above the Cu wirings 10 by rotationally coating a photosensitive polyimide resin film, the uppermost protective film layer 12 at one end of the Cu wirings 10 is removed by exposure and development, to form a bump land 10A. The uppermost protective film layer 12 may be constituted, for example, with a solder resist instead of the photosensitive polyimide resin.

Figure 19:
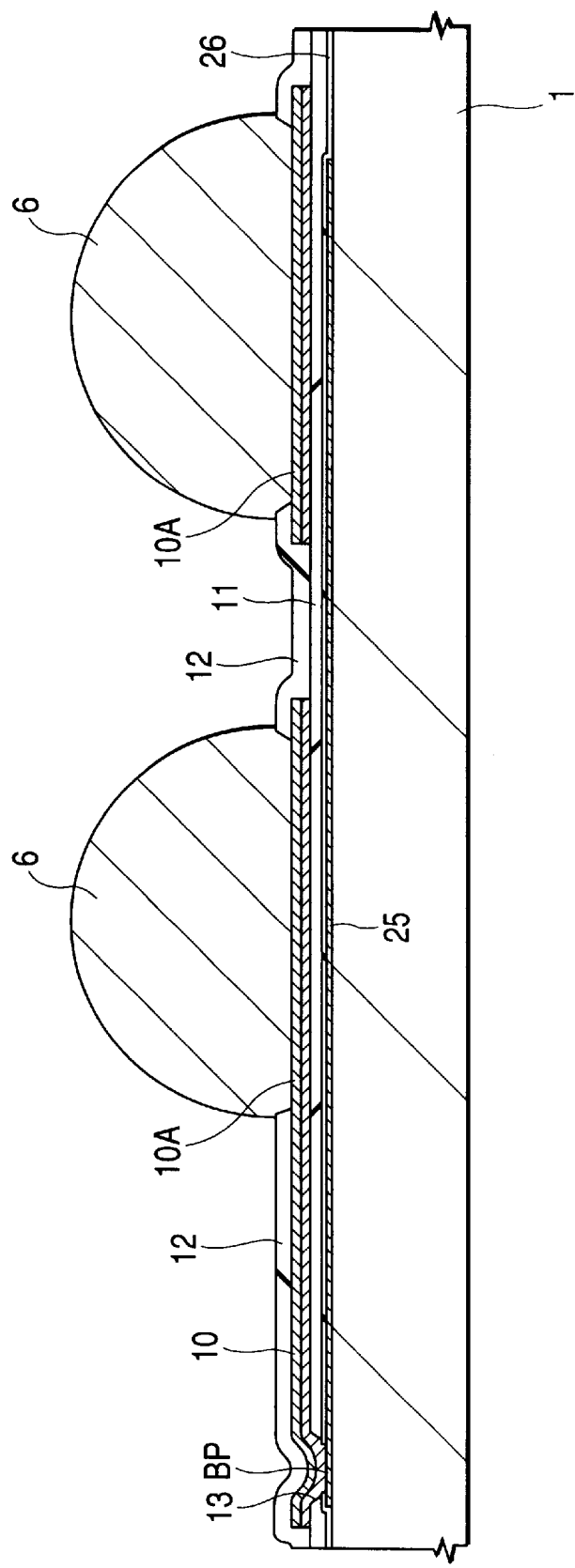
FIG. 19 is a cross sectional view for a main portion of a semiconductor wafer showing a method of manufacturing a semiconductor device as one embodiment according to this invention.
Figure 20:
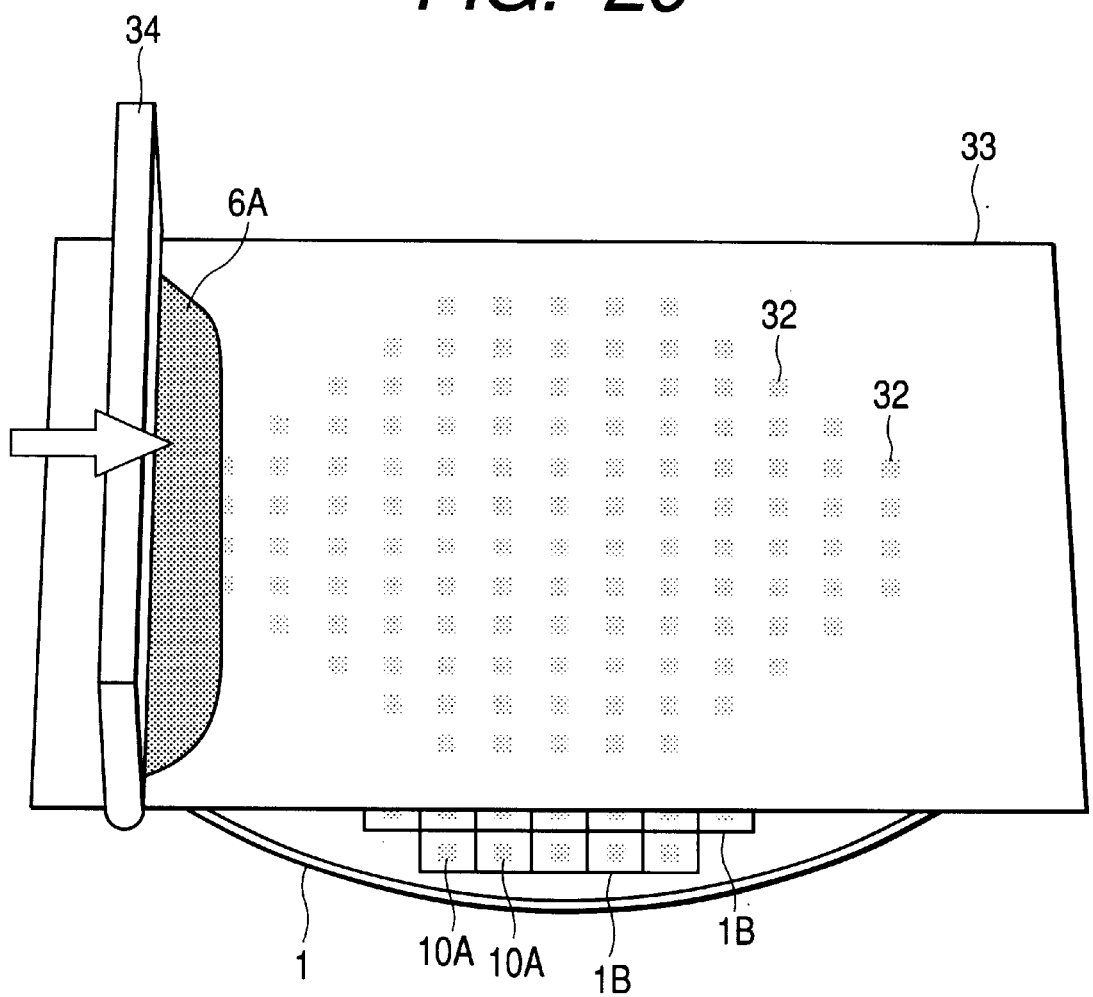
FIG. 20 is an explanatory view showing a step of forming solder bumps of a semiconductor device as one embodiment according to this invention.
Figure 21:
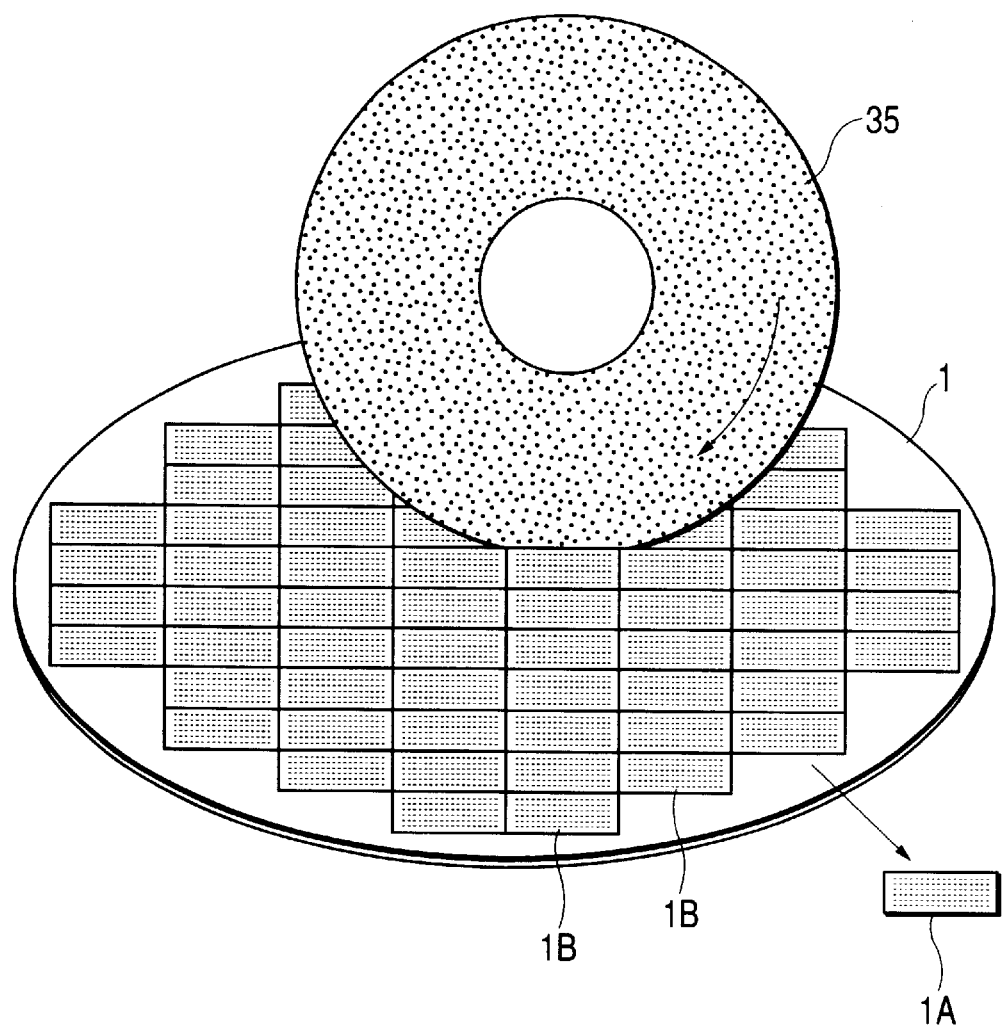
FIG. 21 is an explanatory view showing a wafer dicing step of a semiconductor device as one embodiment according to this invention.

Then, after forming an Au plating layer of about 20 nm to 100 nm thickness (not illustrated) on the surface of the bump land 10A by electroless plating, as shown in FIG. 19, a solder bump 14 is formed on the bump land 10A. As shown in FIG. 20, the solder bump 14 is formed by laying a solder printing mask 33 in which apertures corresponding to the location of the bump lands 10A over the main surface of the wafer 1 and a solder paste 6A is printed on the bump lands 10A by using a squeeze 34. Subsequently, the wafer 1 is heated to a temperature of about 240° C. and the paste 6A on the bump lands 10A is caused to reflow thereby obtaining spherical solder bumps 6 as shown in FIG. 19. The solder bumps 6 can be formed also by supplying solder balls each previously formed into a spherical shape on bump lands 10A and then heating the wafer to reflow the solder ball.

Subsequently, after judging and checking the SRAM formed in each of the chip regions 1B by a probe test, chip regions 1B are individualized into each of pieces by using a dicing blade 35 to obtain a silicon chip 1A shown in FIG. 2. The thus obtained silicon chip 1A is further subjected optionally to various final inspections such as for performance and appearance, then accommodated in a tray jig and conveyed to an assembling step.

For assembling the BGA by using the silicon chip 1A described above, a package substrate 2 as shown in FIG. 22 is at first provided and a flux is printed to the electrode pad 4 on the upper surface thereof and each of the solder bumps 6 of the silicon chip 1A is positioned on the corresponding electrode pad 4. Successively, as shown in FIG. 23, the package substrate 2 is heated at a temperature of about 240° C., and the solder bumps 6 are caused to reflow, thereby connecting the solder bumps 6 and the electrode pads 4.

Figure 24:
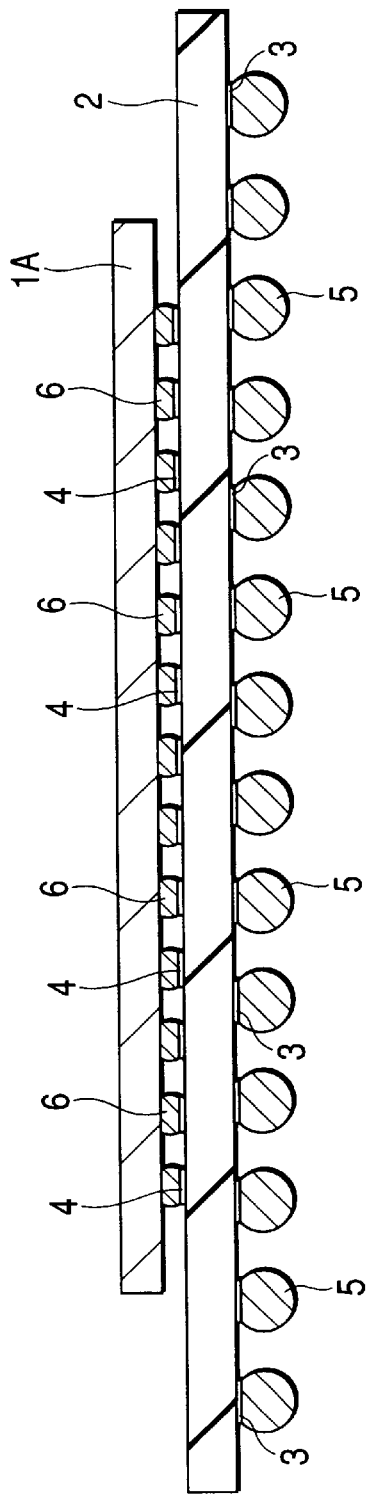
FIG. 24 is a cross sectional view showing a chip mounting step of a semiconductor device as one embodiment according to this invention.

Then, as shown in FIG. 24, solder bumps 5 are connected with the electrode pads 3 on the lower surface of the package substrate 2. The solder bumps 5 are connected to the electrode pads 3 by at first printing a flux on the surface of the electrode pads 4, then supplying solder balls previously molded into a spherical shape onto the electrode pads and then heating the wafer 1 to reflow the solder balls. The solder bumps 5 are constituted of a solder material having a lower melding point than the solder bumps 6 on the main surface of the silicon chip 1A, for example, an eutectic solder comprising 63% of Sn and 37% of Pb (melting temperature is about 183° C.).

Figure 25:
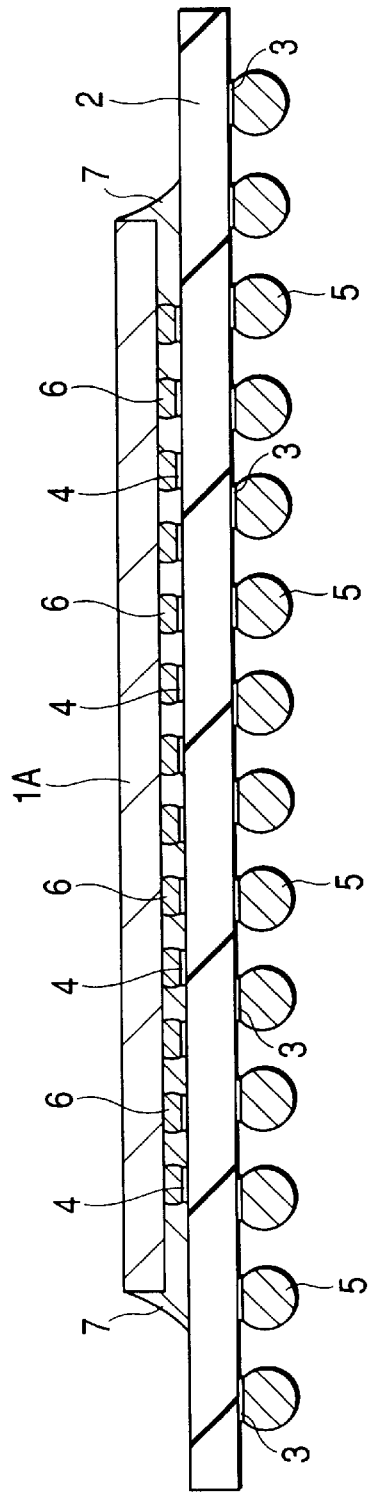
FIG. 25 is a cross sectional view showing a chip mounting step of a semiconductor device as one embodiment according to this invention.
Figure 26:
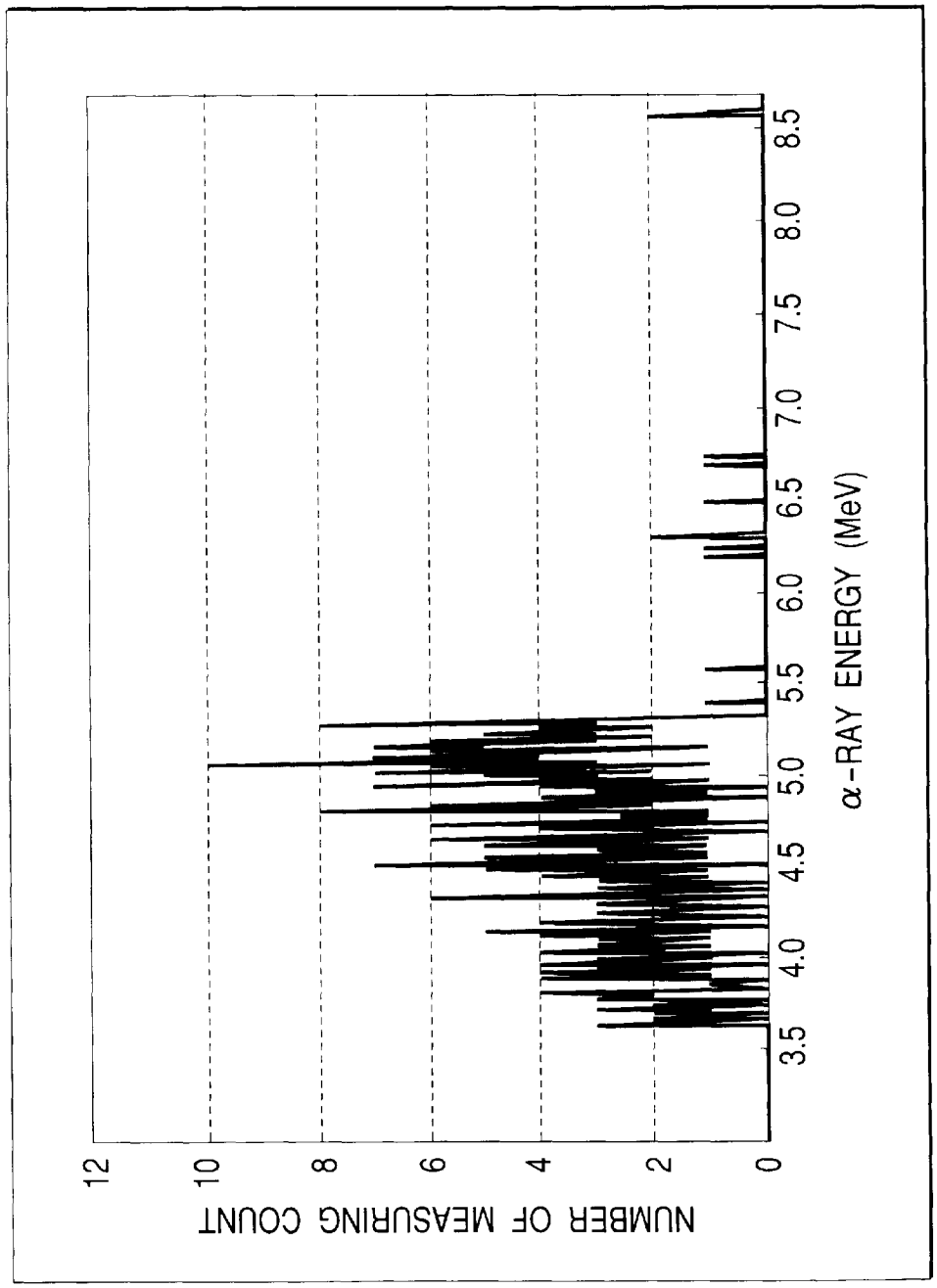
FIG. 26 is a graph showing α-dose radiated from Pb-free solder material measured by present inventors.

Then, after cleaning the upper surface and the lower surface of the package substrate 2 to remove flux residues, an under fill resin 7 is filled in a gap between the upper surface of the package substrate 2 and the main surface of the silicon chip 1A and hardened by heating as shown in FIG. 25. Subsequently, a metal protective plate 8 is bonded on the upper surface of the silicon chip 1A by using adhesives 9 and, by way of hardening of the adhesives 9 and the burn-in inspection, a BGA shown in FIG. 1 is completed.

While the invention made by the present inventors has been described specifically with reference to the embodiment, it will be apparent that this invention is not restricted only to the embodiments but can be modified variously within a scope not departing the gist thereof.

The solder bump formed on the bump lands is not restricted only to the solder material comprising 98.5% of Sn, 1% of Ag and 0.5% of Cu but other solder materials can be used. In this case, it is desirable to constitute the bumps with a Pb-free solder containing 90% or more of Sn and not substantially containing Pb.

The Cu wirings and the bump land are not restricted to the stacked film of the Cu film and the Ni film and any of conductive films may be used so long as it at least comprises Cu as the main ingredient.

The structure of the BGA for mounting the silicon chip is not restricted to that shown in the embodiment described above but it may be embodied in any manner providing that at least a semiconductor chip is mounted by way of the solder bumps to the wiring substrate.

The memory device formed in the silicon chip is not restricted to the SRAM but it may be a memory device such as DRAM (Dynamic Random Access Memory), flash memory, or such memory devices mounted in a hybridized state.

The effects obtained by typical inventions among those disclosed by the present invention are to be explained simply below.

This invention can prevent α-ray induced soft errors in a semiconductor device manufactured by a process of forming Cu wirings and solder bumps on Al wirings prior to the step of dividing a semiconductor wafer in which circuit elements and Al wirings are formed into semiconductor chips.

This invention can prevent α-ray induced soft errors without increasing the number of manufacturing steps for the semiconductor device.

This invention can prevent α-ray induced soft errors without increasing the manufacturing cost for the semiconductor device.

What is claimed is:

1. A semiconductor device, comprising:

memory devices formed on one main surface of a semiconductor substrate;

plural layers of first wirings each having a first conductive film whose principal component is aluminum;

second wirings formed above the first wirings by way of an insulative layer and having a second conductive film whose principal component is copper;

bonding pads comprised of a portion of the uppermost layer in the plural layers of the first wirings and electrically connected with one end of the second wirings;

bump electrode connection portions each comprised of a portion of the second wirings, and bump electrodes including solder formed on the bump electrode connection portions, wherein the film thickness of the bump electrode connection portions is larger that the film thickness of the bonding pads, wherein each of said bump electrode connection portion and said bump electrode has a substantially circular shape in a plane view, and wherein a diameter of said bump electrode connection portion is greater than a diameter of said bump electrode by 50 μm or more.

2. A semiconductor device according to claim 1, wherein the resistance value of the second conductive film is smaller by one digit or more than the resistance value of the first conductive film.

3. A semiconductor device according to claim 1, wherein the second conductive film includes a copper film formed by a plating method.

4. A semiconductor device according to claim 1, wherein the bump electrode comprises a soldering material including Sn (tin) as a main ingredient.

5. A semiconductor device according to claim 4, wherein the soldering material includes 90% or more of Sn (tin).

6. A semiconductor device according to claim 4, wherein the second conductive film comprises a stacked film of a copper film and an Ni (nickel) film formed thereon.

7. A semiconductor device according to claim 1, wherein the thickness of the second conductive film constituting the bump electrode connection portion is greater than the thickness of the interlayer insulative film formed between the first wirings of the plural layers.

8. A semiconductor device according to claim 1, wherein the insulative film interposed between the first wirings and the second wirings comprises a stacked film of an inorganic passivation film and a polyimide resin film formed thereon.

9. A semiconductor device according to claim 8, wherein the thickness of the second conductive film constituting the bump electrode connection portion is greater than the thickness of the inorganic passivation film.

10. A semiconductor device according to claim 8, wherein the thickness of the second conductive film constituting the bump electrode connection portion is greater than the thickness of the polyimide resin film.

11. A semiconductor device according to claim 1, wherein the bump electrode is arranged above the memory device and the bonding pad is arranged in a region where the memory device is not formed.

12. A semiconductor device according to claim 1, wherein the bump electrode does not substantially include Pb.

13. A semiconductor device according to claim 1, wherein the semiconductor chip is mounted by way of the bump electrodes to the wiring substrate.

14. A semiconductor device according to claim 1, wherein the minimum fabrication size of the memory device is 0.2 μm or less.

15. A semiconductor device according to claim 1, wherein the second wirings are covered with the uppermost protective film layer except for the portion constituting the bump electrode connection portions.

16. A semiconductor device according to claim 15, wherein the uppermost protective film layer comprises a polyimide resin film.

* * * * *